United States Patent
Joiner et al.

(10) Patent No.: US 7,898,808 B2
(45) Date of Patent: Mar. 1, 2011

(54) MECHANISMS FOR HEAT TRANSFER IN AN OPTICAL TRANSCEIVER MODULE AND CARD CAGE SYSTEM

(75) Inventors: Charles Steven Joiner, Cupertino, CA (US); Joshua Moore, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 406 days.

(21) Appl. No.: 12/052,596

(22) Filed: Mar. 20, 2008

(65) Prior Publication Data

US 2008/0232067 A1 Sep. 25, 2008

Related U.S. Application Data

(60) Provisional application No. 60/896,847, filed on Mar. 23, 2007.

(51) Int. Cl.
*H05K 7/20* (2006.01)
*H04B 10/02* (2006.01)

(52) U.S. Cl. .................... 361/707; 361/704; 361/709; 361/710; 361/714; 361/715; 398/117; 398/164

(58) Field of Classification Search ............... 361/704, 361/707, 709, 710, 714, 715; 385/92; 372/36; 353/57; 362/294, 345, 373, 580, 547, 218, 362/264; 398/117, 164
See application file for complete search history.

(56) References Cited

U.S. PATENT DOCUMENTS

| | | | |
|---|---|---|---|
| 6,600,611 B2 * | 7/2003 | Inujima et al. ............... 359/808 |
| 6,893,293 B2 * | 5/2005 | Ice et al. .................. 439/607.2 |
| 6,916,122 B2 * | 7/2005 | Branch et al. ................. 385/92 |
| 6,922,516 B2 * | 7/2005 | Kurashima et al. .......... 385/134 |
| 6,935,882 B2 * | 8/2005 | Hanley et al. ................ 439/372 |
| 7,048,452 B2 * | 5/2006 | Malagrino, Jr. ............... 385/92 |
| 7,131,859 B1 * | 11/2006 | Zumbrunnen et al. ........ 439/487 |
| 7,178,996 B2 * | 2/2007 | Malagrino et al. ............. 385/92 |
| 7,195,403 B2 * | 3/2007 | Oki et al. ....................... 385/92 |
| 7,317,617 B2 * | 1/2008 | Meadowcroft et al. ....... 361/715 |
| 7,322,850 B2 * | 1/2008 | Neer et al. .................... 439/567 |
| 7,371,965 B2 * | 5/2008 | Ice ................................ 174/50 |
| 7,491,090 B2 * | 2/2009 | Oki et al. ............... 439/607.17 |
| 7,530,835 B2 * | 5/2009 | Yu et al. ...................... 439/372 |
| 2003/0002824 A1 * | 1/2003 | Chan et al. ..................... 385/92 |
| 2003/0141090 A1 * | 7/2003 | Kruger et al. .................. 174/50 |

(Continued)

FOREIGN PATENT DOCUMENTS

JP 2010085805 A * 4/2010

(Continued)

Primary Examiner—Anatoly Vortman
(74) Attorney, Agent, or Firm—Workman Nydegger (57) ABSTRACT

Mechanisms and systems for dissipating heat from an optical transceiver module to a module card cage system. In one embodiment, a thermal conductive label having at least one raised portion is attached to a surface of the module. The raised portion is configured to contact at least a portion of the card cage to dissipate heat from the module to the card cage. In another embodiment, the card cage has a protruding depression formed on a part of its surface that is above a slot configured to receive an optical transceiver module. The protruding depression is configured to contact at least a portion of the module to dissipate heat from the module to the card cage.

8 Claims, 8 Drawing Sheets

U.S. PATENT DOCUMENTS

| | | | |
|---|---|---|---|
| 2003/0169983 A1* | 9/2003 | Branch et al. | 385/92 |
| 2003/0236019 A1* | 12/2003 | Hanley et al. | 439/372 |
| 2004/0027816 A1* | 2/2004 | Ice | 361/797 |
| 2004/0101257 A1* | 5/2004 | Kruger et al. | 385/92 |
| 2004/0203289 A1* | 10/2004 | Ice et al. | 439/607 |
| 2005/0226571 A1* | 10/2005 | Malagrino et al. | 385/92 |
| 2006/0270275 A1* | 11/2006 | Morohashi et al. | 439/607 |
| 2006/0274518 A1* | 12/2006 | Yu et al. | 361/816 |
| 2007/0134003 A1* | 6/2007 | Lee et al. | 398/164 |
| 2008/0031620 A1* | 2/2008 | Hudgins et al. | 398/9 |
| 2008/0247762 A1* | 10/2008 | Yoshikawa et al. | 398/138 |

FOREIGN PATENT DOCUMENTS

WO      WO 03060583 A1 * 7/2003

* cited by examiner

MECHANISMS FOR HEAT TRANSFER IN AN OPTICAL TRANSCEIVER MODULE AND CARD CAGE SYSTEM

CROSS-REFERENCE TO RELATED APPLICATIONS

This application claims the benefit of U.S. Provisional Application No. 60/896,847, filed Mar. 23, 2007, which is incorporated herein by reference in its entirety.

BACKGROUND

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

In many applications, optical transceivers are implemented as a module of various form factors such as SFP and the like. The module typically includes the various electronic and optical components necessary for data transmission such as the laser diode, laser driver, photo-diode, and post-amplifier enclosed in a shell or encasing, typically made of metal. It is often desirable for the module to be hot-pluggable, which permits the module to be inserted and removed from a module card cage or other similar device without removing electrical power.

One common difficulty associated with the operation such modules is the generation of electromagnetic radiation. The generation of electromagnetic radiation by a module is a matter of significant concern because such electromagnetic radiation can cause electromagnetic interference (EMI) with other systems and devices in the vicinity, which can seriously impair, if not prevent, the proper operation of those other systems and devices.

In addition, when the modules are plugged into a module card cage or like, they generate heat that must be accounted for. If the heat is not properly dissipated or transferred away from the module, damage may occur to the module. Thus, the control of EMI effects and heat transfer are important considerations in the design and use of hot-pluggable modules.

BRIEF SUMMARY

One embodiment disclosed herein relates to a heat dissipation mechanism for an optical transceiver module that is configured to be inserted into a module card cage. This embodiment comprises a thermal conductive label having at least one raised portion attached to a surface of the optical transceiver module. The at least one raised portion is configured to contact at least a portion of a module card cage when the optical transceiver module is inserted into the module card cage so as to dissipate heat from the optical transceiver to the module card cage.

Another embodiment disclosed herein relates to a heat dissipation mechanism for an optical transceiver module card cage system cage having at least one slot configured to receive an optical transceiver module inserted into the slot. This embodiment comprises a depression formed on a portion of the module card cage that is on top of at least a portion of the slot, the depression protruding into the slot. The depression is configured to contact at least a portion of the surface of an optical transceiver module inserted into the slot so as to dissipate heat from the optical transceiver to the module card cage.

A further embodiment disclosed herein relates to a method for providing a heat dissipation mechanism in an optical transceiver module card cage system. This embodiment comprises providing a module card cage having at least one slot configured to receive an optical transceiver module, providing an optical transceiver module configured for insertion into the slot of the module card cage, and providing at least one contact point configured to contact a portion of the module card cage and a portion of the optical transceiver module when the optical transceiver module is inserted into the slot of the module card cage so as dissipate heat from the optical transceiver to the module card cage.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

Figure 1A:
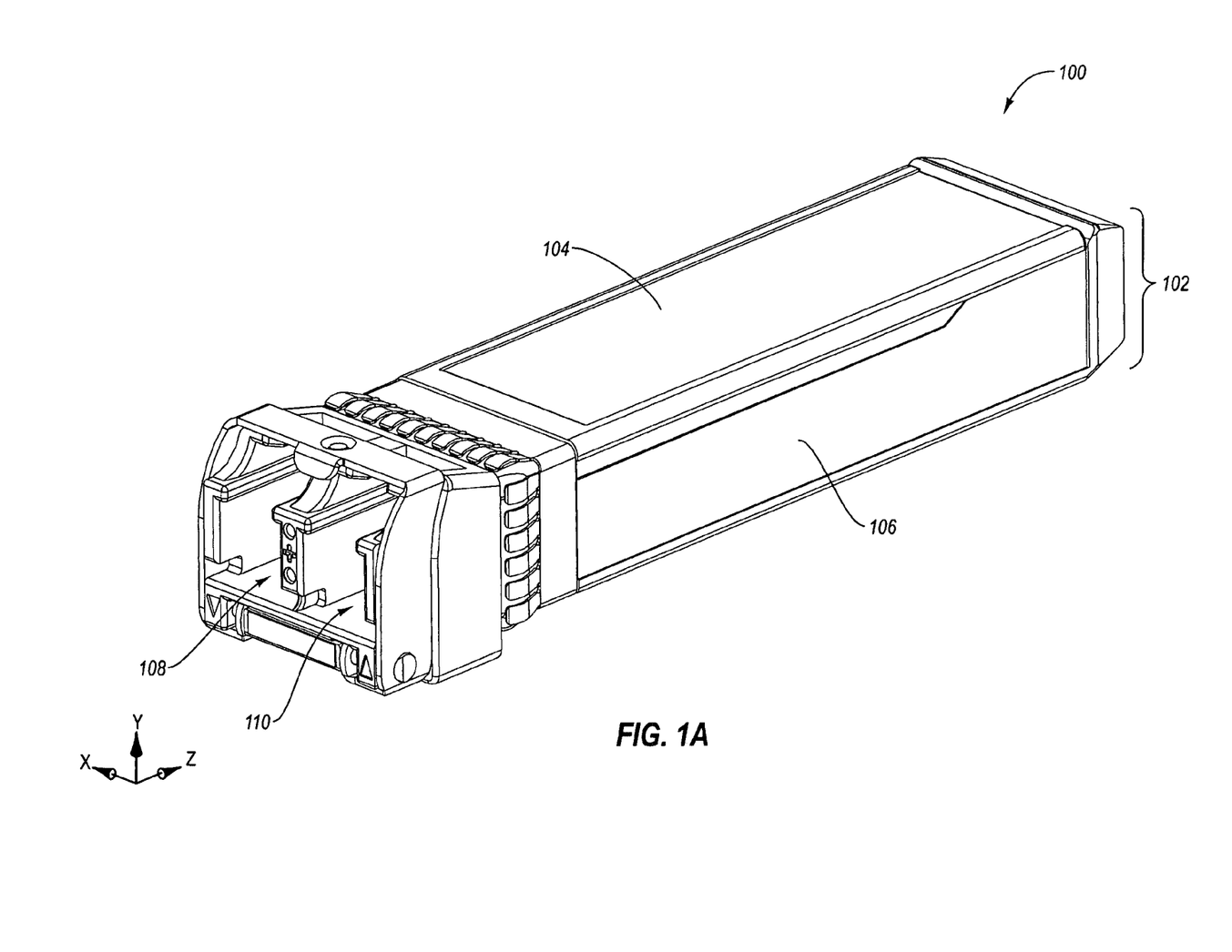
FIG. 1A is a top perspective view of an example optoelectronic transceiver module.
Figure 1B:
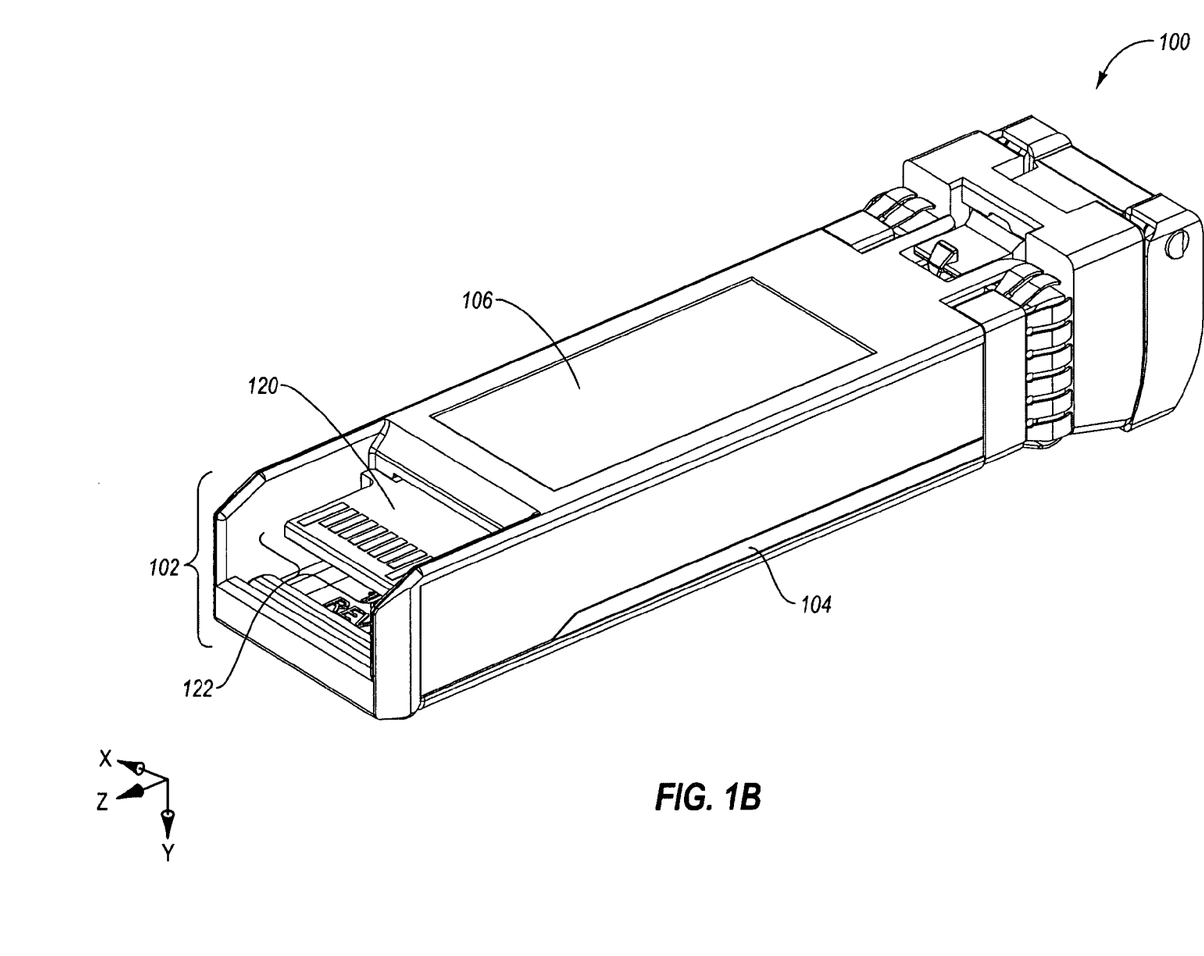
FIG. 1B is a bottom perspective view of the example optoelectronic transceiver module of FIG. 1A.
Figure 1C:
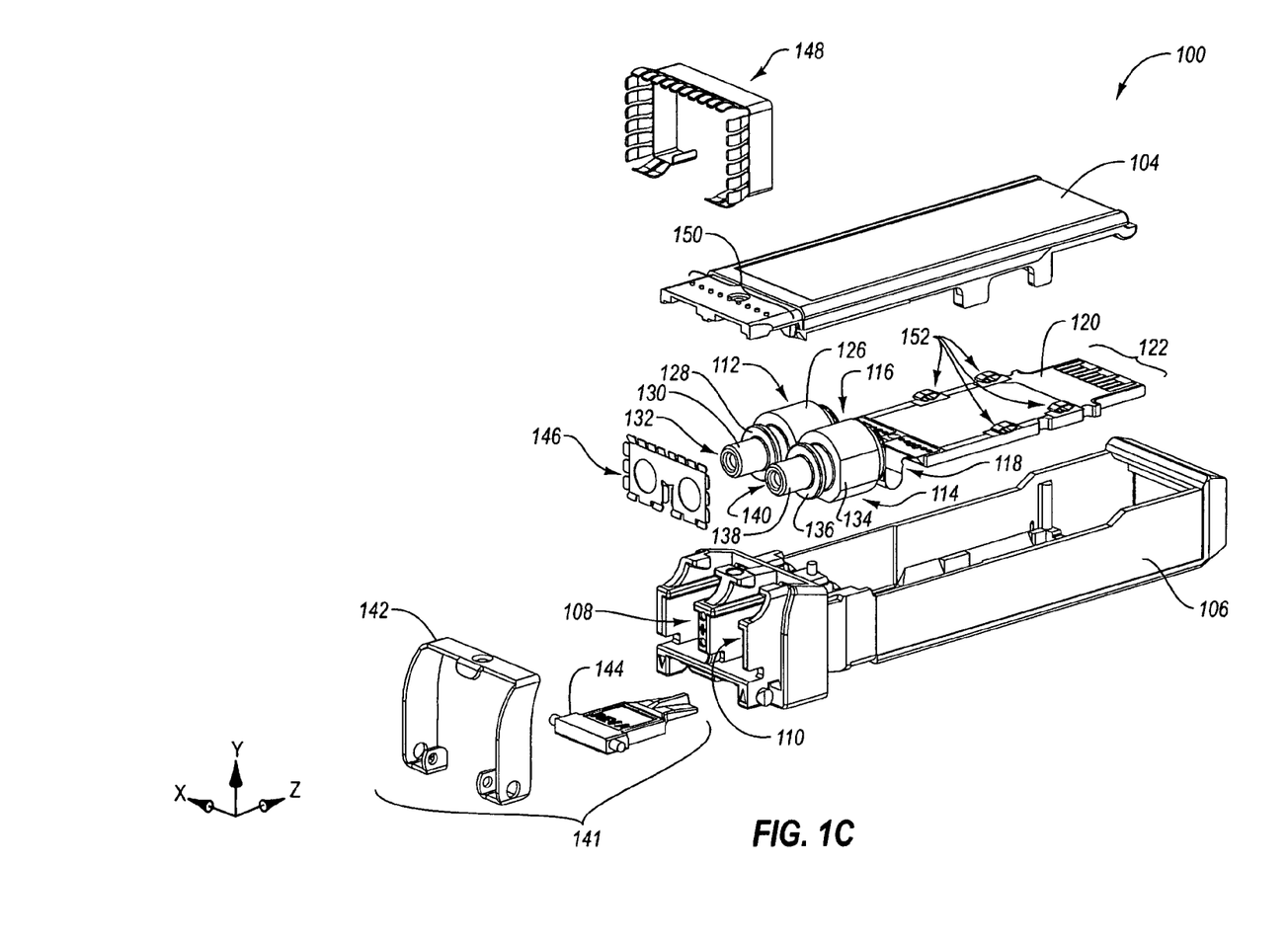
FIG. 1C is an exploded perspective view of the example optoelectronic transceiver module of FIG. 1A.

Reference is first made to FIGS. 1A-1C which disclose aspects of an example optoelectronic transceiver module 100 for use in transmitting and receiving optical signals in connection with a host device (not shown). As disclosed in FIGS. 1A and 1B, the optoelectronic transceiver module 100 comprises various components, including a shell 102 that includes a top shell 104 rotatably attached to a bottom shell 106. An output port 108 and an input port 110 are defined in the bottom shell 106. The top shell 104 and the bottom shell 106 can be formed using a die casting process, machining operation, or any other suitable process(es). One example material from which the top shell 104 and the bottom shell 106 can be die cast is zinc, although the top shell 104 and the bottom shell 106 may alternatively be die cast or otherwise constructed from other suitable materials such as aluminum, or any other suitable material(s).

As disclosed in FIG. 1C, the example optoelectronic transceiver module 100 also includes a transmitter optical subassembly (TOSA) 112, a receiver optical subassembly (ROSA) 114, electrical interfaces 116 and 118, and a printed circuit board (PCB) 120 having an edge connector 122. The two electrical interfaces 116 and 118 are used to electrically connect the TOSA 112 and the ROSA 114, respectively, to the PCB 120.

The TOSA 112 of the optoelectronic transceiver module 100 includes a barrel 126 within which an optical transmitter, such as a laser (not shown), is disposed. The optical transmitter is configured to convert electrical signals received through the PCB 120 from a host device (not shown) into corresponding optical signals. The TOSA 112 also includes a flange 128 and a nose piece 130. The nose piece 130 defines a port 132. The port 132 is configured to optically connect the optical transmitter disposed within the barrel 126 with a fiber-ferrule (not shown) removably received within the output port 108.

Similarly, the ROSA 114 of the optoelectronic transceiver module 100 includes a barrel 134, a flange 136, and a nose piece 138. The nose piece 138 defines a port 140. The port 140 is configured to optically connect an optical receiver, such as a photodiode (not shown), disposed within the barrel 134 to a fiber-ferrule (not shown) disposed within the input port 110. The optical receiver is configured to convert optical signals received from the fiber-ferrule into corresponding electrical signals for transmission to a host device (not shown) through the PCB 120.

The optoelectronic transceiver module 100 can be configured for optical signal transmission and reception at a variety of per-second data rates including, but not limited to, 1 Gbit, 2 Gbit, 2.5 Gbit, 4 Gbit, 8 Gbit, 10 Gbit, 17 Gbit, 40 Gbit, 100 Gbit, or higher. Furthermore, the optoelectronic transceiver module 100 can be configured for optical signal transmission and reception at various wavelengths including, but not limited to, 850 nm, 1310 nm, 1470 nm, 1490 nm, 1510 nm, 1530 nm, 1550 nm, 1570 nm 1590 nm, or 1610 nm. Further, the optoelectronic transceiver module 100 can be configured to support various communication standards including, but not limited to, Fast Ethernet, Gigabit Ethernet, 10 Gigabit Ethernet, and 1×, 2×, 4×, and 10× Fibre Channel. In addition, although one example of the optoelectronic transceiver module 100 is configured to have a form factor that is substantially compliant with the SFP+ (IPF) MSA, the optoelectronic transceiver module 100 can alternatively be configured to have a variety of different form factors that are substantially compliant with other MSAs including, but not limited to, the SFF MSA or the SFP MSA.

With continued reference to FIG. 1C, the optoelectronic transceiver module 100 also includes a latching mechanism 141 which includes a bail 142 and a latch 144. The optoelectronic transceiver module 100 further includes an optical subassembly (OSA) positioning plate 146, a collar clip 148, an interlocking seam 150, and four PCB positioning mechanisms 152.

Figure 2:
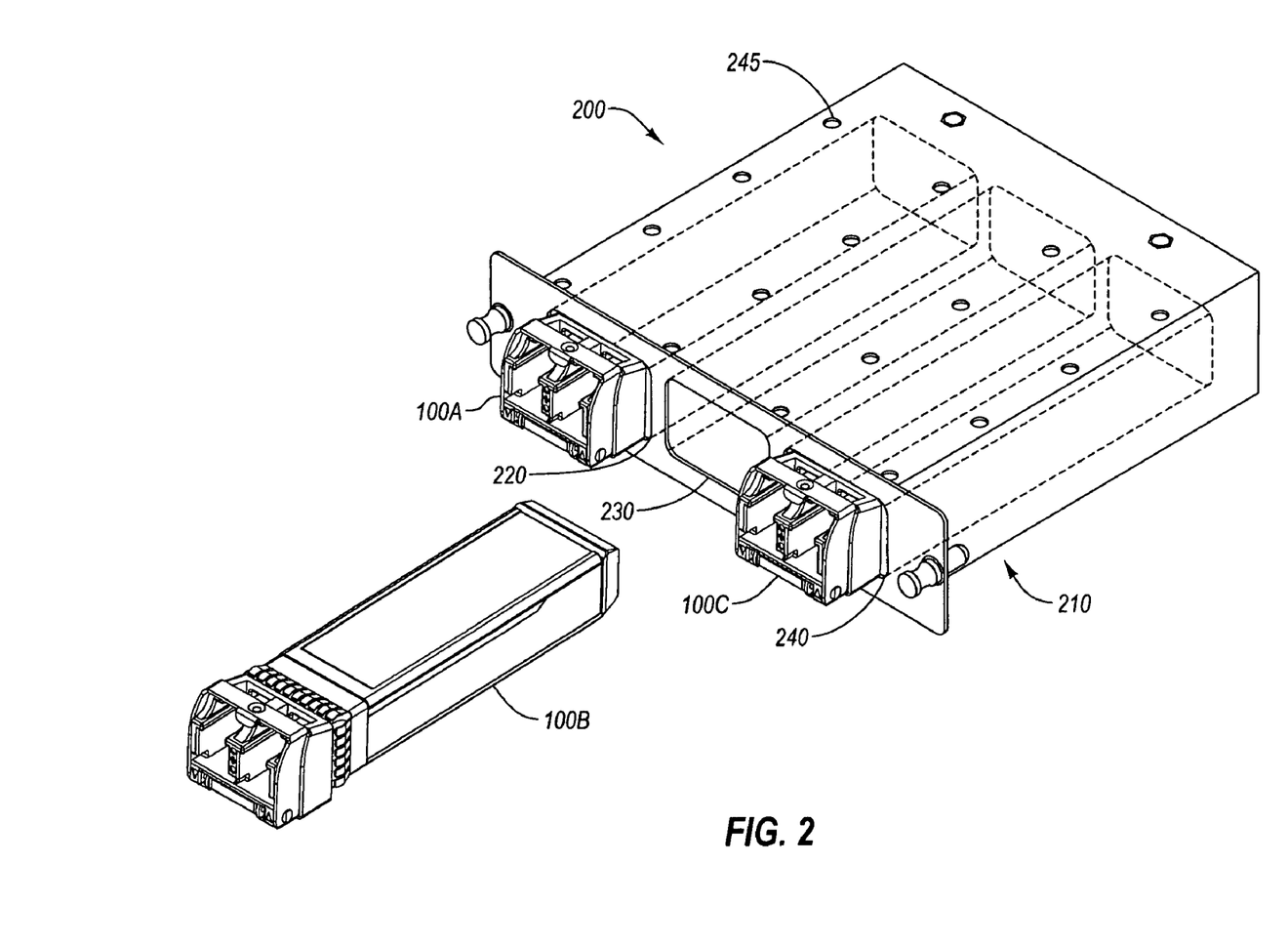
FIG. 2 illustrates a module card cage system having optical transceiver modules inserted therein.

In many applications, it is often common for one or more optical transceiver modules 100 to be inserted into a multi-port card cage or other similar device. The multi-port card cage typically allows one or more of the transceiver modules 100 to be implemented at the same time. Referring now to FIG. 2, a module card cage system 200 is illustrated. As shown, module card cage system 200 includes a module card cage 210 (hereinafter also referred to simply as a "card cage") which may be made of metal or any other suitable material and may be any reasonable card cage known in the art. As illustrated, card cage 210 includes three ports or slots 220, 230 and 240. Note that one of skill in the art will appreciate that card cage 210 may have more or less than the three ports or slots shown.

As further illustrated, three optical transceiver modules 100A, 100B, and 100C, which may correspond to optical transceiver module 100, are shown as either being inserted into module card cage 210 at ports or slots 220 and 240 or in the case of optical transceiver 100B as being able to be inserted into port or slot 230. Of course, it will be appreciated that in some embodiments not all the ports or slots need have an optical transceiver module inserted therein.

As will be appreciated, the inserted optical transceivers 100A, 100B, and 100C generate heat during operation that needs to be transferred or dissipated to prevent damage to the optical transceiver modules. One common heat dissipation technique is to include one or more holes or openings 245 in the body of card cage 210. The holes or openings 245 allow for heat to be dissipated from the inserted optical transceiver modules to the card cage 210 and then into the surrounding air. While this method has generally proven effective for heat transfer, it has often led to increased Electro-Magnetic Interference (EMI) problems. For example, the holes or openings 245 allow EMI produced by the inserted modules to escape card cage 210, which is typically undesirable.

Advantageously, the principles of the present invention allow for increased high thermal conductive material to be placed between the inserted optical transceiver modules 100A, 100B, 100C and the card cage 210 in order to create an efficient thermal path from the modules 100A, 100B, and 100C to the card cage 210. This allow for the removal of holes or openings 245 while still dissipating the heat produced by the modules 100A, 100B, and 100C.

In one embodiment, the metal-to-metal contact between an inserted optical transceiver module 100 and the card cage 210 is increased to create an efficient thermal conductive path from the inserted optical transceiver to the card cage. Such an embodiment is illustrated in FIGS. 3A and 3B, which show a front view and top perspective view of card cage 210 and ports or slots 220, 230, and 240.

Figure 3A:
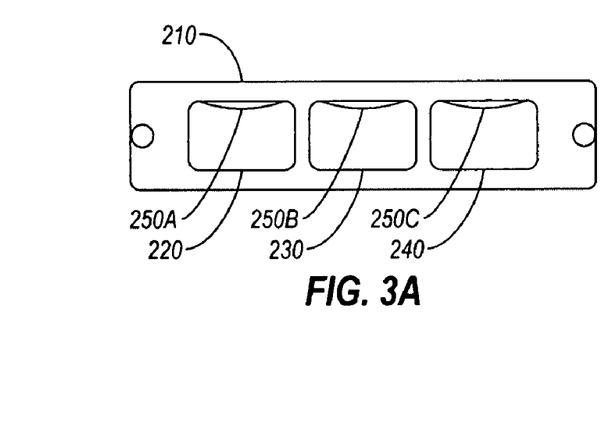
FIG. 3A illustrates a front view of a heat dissipation mechanism for a module card cage in accordance with an embodiment disclosed herein.
Figure 3B:
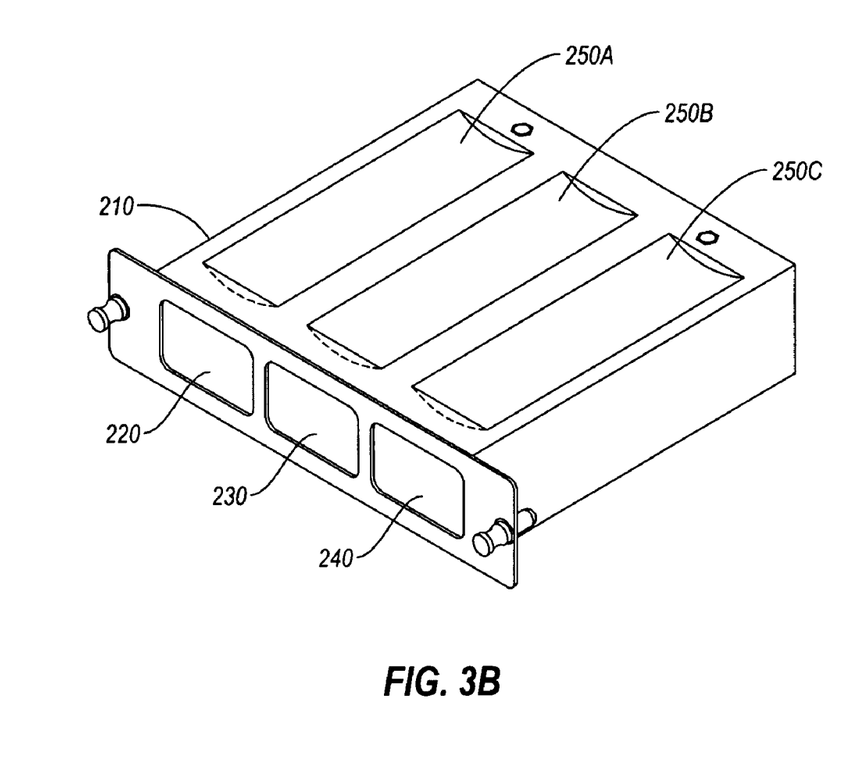
FIG. 3B illustrates a top perspective view of a heat dissipation mechanism for a module card cage in accordance with an embodiment disclosed herein.

As illustrated in both FIGS. 3A and 3B, the ports or slots 220, 230, and 240 include a depression 250A, 250B, and 250C that extend or protrude into the slots 220, 230, and 240 respectively. The depressions 250 are made during manufacture time of card cage 210 by machining or pressing by any process known in the art the depressions 250 into the top surface of the body of card cage 210. As shown, this process creates a flexible, springy metal protrusion or depression 250A, 250B, and 250C that are configured to make contact with at least a portion of top shell 104 of an inserted optical transceiver module such as optical transceiver module 100.

During operation, a user may insert optical transceiver module 100A into port or slot 220, optical transceiver module 100B into port or slot 230, and/or optical transceiver module 100C into port or slot 240. While being inserted and during operation, depression 250A, 250B, and/or 250C will make contact with the top shell 104 of the transceiver module 100A, 100B, and 100C respectively. Accordingly, the heat produced by optical transceiver modules 100A, 100B and 100C is substantially transferred from the transceiver modules to card cage 210, where it may be dissipated into the surrounding air.

The flexible, springy nature of the depressions 250 generally allow for the easy insertion of optical transceiver modules 100A, 100B, and 100C as the depressions will move as needed. Note that it may be advantageous in some embodiments to limit the depressions 250 to about 70% to 80% of the length of card cage 210, as illustrated, in order to leave sufficient room for maneuvering the optical transceiver modules during insertion of the modules into the card cage 210.

Figure 4A:
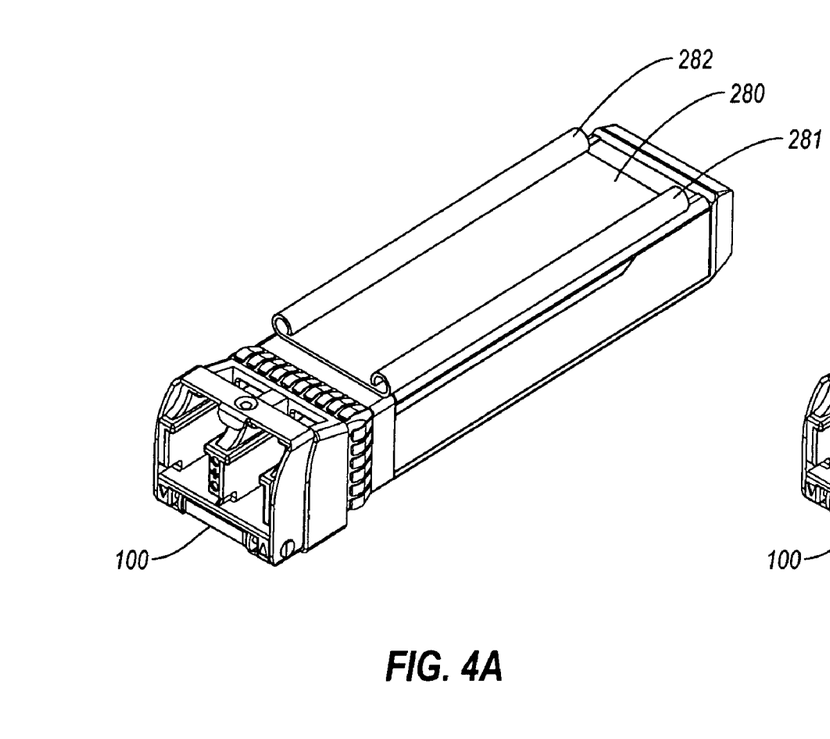
FIG. 4A illustrates a top perspective view of a heat dissipation mechanism for an optical transceiver module in accordance with an embodiment disclosed herein.
Figure 4B:
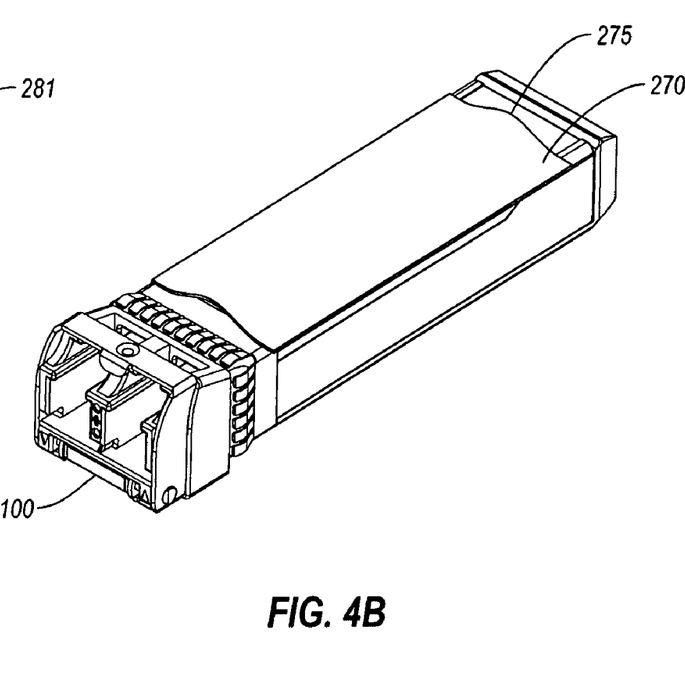
FIG. 4B illustrates a top perspective view of a heat dissipation mechanism for an optical transceiver module in accordance with an embodiment disclosed herein.
Figure 4C:
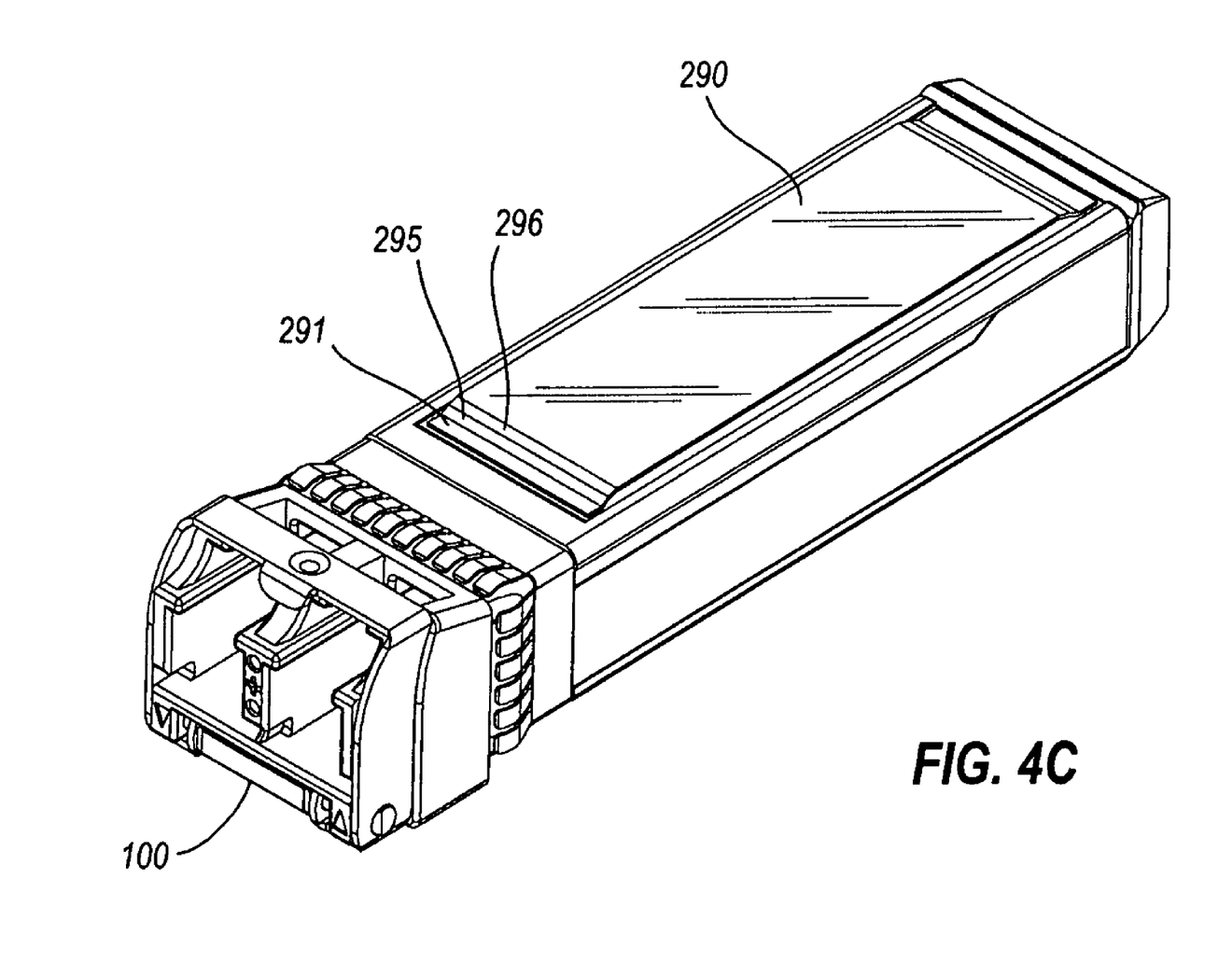
FIG. 4C illustrates a top perspective view of a heat dissipation mechanism for an optical transceiver module in accordance with an embodiment disclosed herein.

Turning now to FIGS. 4A-4C, alternative embodiments to increase the thermal conductive path from an inserted optical transceiver to the module card cage are illustrated. Referring first to FIG. 4A, an optical transceiver 100 is illustrated that includes a label 280 placed on top of top shell 104. In some embodiments, label 280 may be comprised of a thin sheet of conductive metal such as copper or aluminum. In other embodiments, label 280 may be a thermal conductive material such as silicon dioxide. Label 280 may be attached to top shell 104 by applying an adhesive (not shown), which may be any reasonable adhesive known to those of skill in the art, to those portions of label 280 that touch top shell 104. Label 280 may further include manufacturer information, module information and other information if so desired.

As further illustrated, label 280 includes two raised ridges 281 and 282, which may be formed by rolling over the edges of the metal or other material comprising label 280 during manufacture time. Advantageously, the raised ridges 281 and 282 form a flexible, springy surface that is configured to contact at least a portion of the surface of the card cage 210 while still being flexible enough to allow for ease of insertion of a transceiver module 100 into a port or slot of the card cage 210.

For example, during operation a user may insert optical transceiver module 100 into port or slot 220, 230, or 240. While being inserted and during operation, raised ridges 281 and 282 will make contact with the surface of card cage 210. Accordingly, the heat produced by optical transceiver module 100 is transferred from the transceiver module to card cage 210, where it may be dissipated into the surrounding air.

Referring now to FIG. 4B, a further embodiment to increase the thermal conductive path from an inserted optical transceiver module 100 to the card cage 210 is illustrated. As shown, a label 270 is placed on top of top shell 104. In some embodiments, label 270 may be comprised of a thin sheet of conductive metal such as copper or aluminum. In other embodiments, label 270 may be a thermal conductive material such as silicon dioxide. Label 270 may be attached to optical transceiver module 100 by applying an adhesive (not shown), which may be any reasonable adhesive known to those of skill in the art, to those portions of label 270 that touch top shell 104. Label 270 may further include manufacturer information, module information, and other information if so desired.

As further illustrated in FIG. 4B, label 270 includes a raised middle section 275 that is formed by raising the metal or other material comprising label 270 during manufacture time. Advantageously, the raised middle section 275 forms a flexible, springy surface that is configured to contact at least a portion of the surface of the card cage 210 while still being flexible enough to allow for ease of insertion of the transceiver module 100 into a port or slot of the card cage. It will be appreciated that adhesive 276 will generally not be applied to the raised middle section 275.

For example, during operation a user may insert optical transceiver module 100 into port or slot 220, 230, or 240. While being inserted and during operation, raised middle section 275 makes contact with the inner surface of card cage 210. Accordingly, the heat produced by optical transceiver module 100 is transferred from the transceiver module 100 to card cage 210, where it may be dissipated into the surrounding air.

Turning now to FIG. 4C, an additional embodiment to increase the thermal conductive path from an inserted optical transceiver module 100 to the card cage 210 is illustrated. As shown, a label 290 is placed on top of top shell 104. In this embodiment, label 290 may be a thermal sandwich having a bottom metal layer 291 and a top metal layer 296, both of which may be a thin sheet of conductive metal such as copper or aluminum. A compressible thermal pad or thermal grease 295 is placed between the top layer 296 and the bottom layer 291. Thermal pad 295 may be a Sarcon® gap filler pad, GR-M silicone-based material, or any other suitable thermal material known in the art. Label 290 may be attached to optical transceiver module 100 by applying an adhesive (not shown), which may be any reasonable adhesive known to those of skill in the art, to bottom layer 291, which touches top shell 104. Label 290 may further include manufacturer information, module information, and other information if so desired. Label 290 advantageously provides a thermal interface that can accommodate large gaps between the module 100 and card cage 210 and that is durable enough for multiple insertions.

As further illustrated in FIG. 4C, label 290 includes at least one raised portion in that thermal pad 295 and top layer 296 are raised from or higher then bottom layer 291 and top shell 104. The compressible nature of thermal pad 295 allows it to compress as needed when module 100 is inserted into port or slot 220, 230, or 240 so that top layer 296 makes contact with the inner surface of card cage 210. In addition, when the module 100 is inserted into the card cage 210, thermal pad 295 is compressed providing good thermal contact between top layer 296 and bottom layer 291. Accordingly, the heat produced by optical transceiver module 100 is transferred from the transceiver module 100 to card cage 210, where it may be dissipated into the surrounding air.

In some embodiments, it may be advantageous to combine the various embodiments disclosed herein. For example, in one embodiment a depression 250 may be formed on the surface of card cage 210 as previously described while a label 270, 280 or 290 may be attached to the optical transceiver module 100 as previously described. In such embodiments, the simultaneous use of both the depression 250 and the labels 270, 280 or 290 may result in an increased metal-on-metal contact area between the optical transceiver module 100 and the surface of the card cage 210 that may in turn cause a greater heat transfer from the optical transceiver module to the card cage and the surrounding air.

Figure 5:
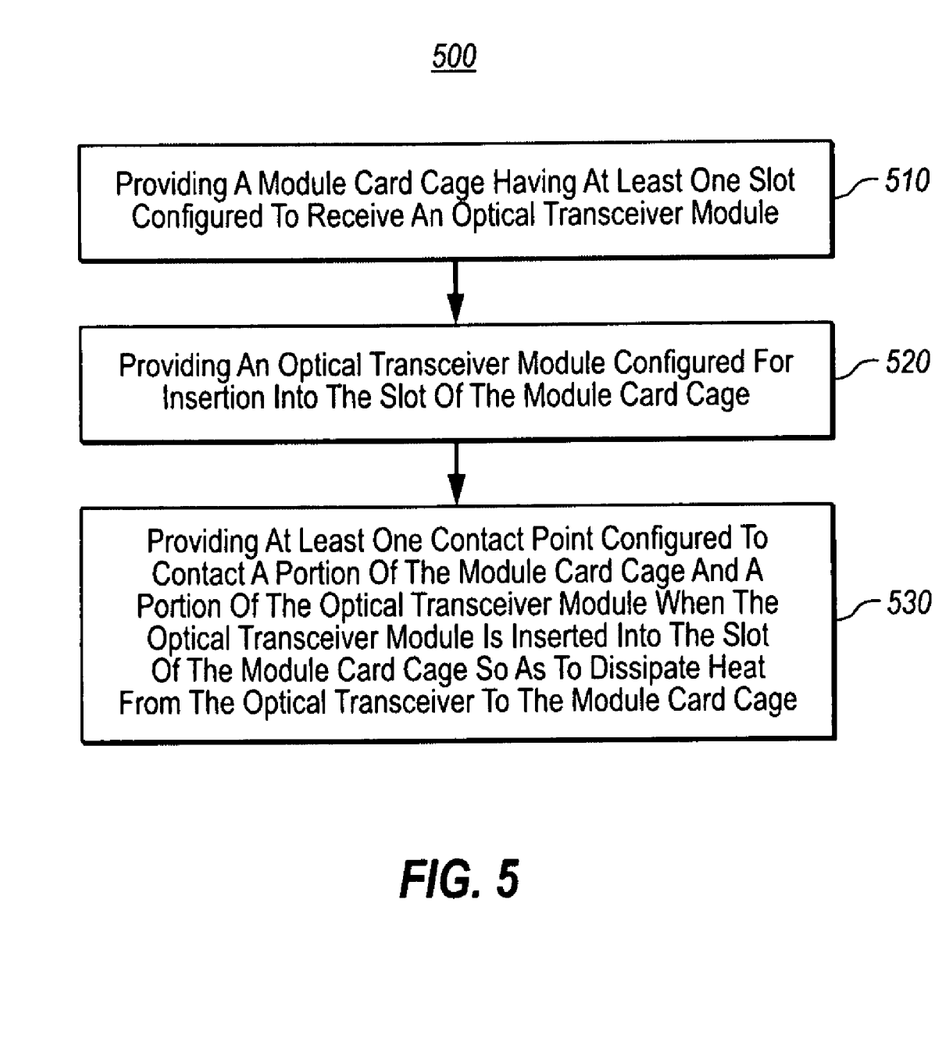
FIG. 5 illustrates a flowchart of a method for providing a heat dissipation mechanism in an optical transceiver module card cage system in accordance with an embodiment disclosed herein.

FIG. 5 shows a flow chart of a method 500 for providing a heat dissipation mechanism in an optical transceiver module card cage system. At 510, a module card cage having at least one slot is provided. At 520, an optical transceiver module configured for insertion into the slot of the module card cage is provided. At 530, at least one contact point configured to contact a portion of the module card cage and a portion of the optical transceiver module when the optical transceiver module is inserted into the slot of the module card cage so as to dissipate heat from the optical transceiver to the module card cage is provided. As previously discussed, the at least one contact point may be the protruding depression 250 and/or the raised portion of the thermal conductive label 270/280/290. As previously the mentioned, the raised portion of the thermal conductive label 270/280/290 may be the raised middle section 275, the raised ridges 281 and/or 282, or the combination of the thermal pad 295 and top metal layer 296 that rise above the bottom layer 291.

Accordingly, the principles of the present invention advantageously provide for a heat transfer or dissipation mechanism for an optical transceiver module and module card cage system. As described, the mechanism allows for heat to be transferred from the optical transceiver module to the module card cage system. In addition, the principles of the present invention provide for reduced EMI emissions as the need to make holes in the body of the module card cage for heat dissipation is removed. Accordingly, the module card cage is better able to shield for EMI when using the principles of the present invention while still providing sufficient heat transfer from the optical transceiver module to the module card cage system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A heat dissipation mechanism for an optical transceiver module that is configured to be inserted into a module card cage comprising:
   a thermal conductive label having at least one raised portion attached to a surface of the optical transceiver module; and
   a depression formed on a surface of the module card cage that is on top of at least a portion of a slot of the module card cage configured to receive the optical transceiver module, the depression protruding into the slot;
   wherein the at least one raised portion is configured to contact at least a portion of a module card cage when the optical transceiver module is inserted into the module card cage so as to dissipate heat from the optical transceiver to the module card cage; and
   wherein the depression is configured to contact at least a portion of the surface of the optical transceiver module inserted into the slot so as to further dissipate heat from the optical transceiver to the module card cage.

2. The heat dissipation mechanism in accordance with claim 1, wherein the conductive label is comprised of a thin sheet of metal.

3. The heat dissipation mechanism in accordance with claim 1, wherein the conductive label is comprised of a thermal conductive material.

4. The heat dissipation mechanism in accordance with claim 1, wherein the at least one raised portion comprises at least one raised ridge positioned at an edge of the conductive label.

5. The heat dissipation mechanism in accordance with claim 4, wherein the conductive label includes two raised ridges positioned on opposite edges of the conductive label.

6. The heat dissipation mechanism in accordance with claim 1, wherein the at least one raised portion comprises a raised middle section.

7. The heat dissipation mechanism in accordance with claim 1, wherein the conductive label is attached to the surface of the optical transceiver module using an adhesive.

8. The heat dissipation mechanism in accordance with claim 1, wherein the thermal conductive label comprises a thermal sandwich comprising a bottom metal layer, a top metal layer, and a thermal pad or thermal grease inserted between the top and bottom metal layers, the at least one raised portion comprising the thermal pad or grease and the top metal layer that rise above the bottom metal layer.

* * * * *